(12) United States Patent
Abramovici et al.

(10) Patent No.: US 7,058,918 B2
(45) Date of Patent: Jun. 6, 2006

(54) RECONFIGURABLE FABRIC FOR SOCS USING FUNCTIONAL I/O LEADS

(75) Inventors: Miron Abramovici, Berkeley Heights, NJ (US); Alfred E. Dunlop, Kattskill Bay, NY (US)

(73) Assignee: Dafca, Inc., Framingham, MA (US)

( * ) Notice: Subject to any disclaimer, the term of this patent is extended or adjusted under 35 U.S.C. 154(b) by 409 days.

(21) Appl. No.: 10/425,101

(22) Filed: Apr. 28, 2003

(65) Prior Publication Data

US 2004/0212393 A1    Oct. 28, 2004

(51) Int. Cl.
*G06F 17/50* (2006.01)

(52) U.S. Cl. .............................. 716/12; 716/17; 716/18
(58) Field of Classification Search .................. 716/99, 716/11, 12, 17, 1, 18
See application file for complete search history.

(56) References Cited

U.S. PATENT DOCUMENTS

| 6,484,280 B1 | 11/2002 | Moberly |
| 6,567,969 B1 * | 5/2003 | Agrawal et al. ............... 716/17 |
| 2002/0073380 A1 * | 6/2002 | Cooke et al. .................. 716/1 |

FOREIGN PATENT DOCUMENTS

| EP | 1296152 A1 | 3/2003 |
| WO | WO 01/71876 A1 | 9/2001 |

OTHER PUBLICATIONS

Koranne, Sandeep, "A Novel Reconfigurable Wrapper for Testing of Embedded Core-Based SOCs and its Associated Scheduling Algorithm", Journal of Elctronic Testing: Theory and Applications, vol. 18, No. 4-5, Sep. 2002.
Huang, J.-R., et al., "A Self-Test Methodology for IP Cores in Bus-Based Programmable SoCs"; IEEE, pp. 198-203, 2001.
U.S. Appl. No. 10/379,043, filed Mar. 4, 2003.

* cited by examiner

*Primary Examiner*—Thuan Do

(57) ABSTRACT

An exceptionally effective SoC design is achieved by the user of wrappers that comprise a functionally reconfigurable module (FRM) that is capable of affecting the operational functionality of the wrapper and that, consequently, is capable of affecting the operational functionality of a designed SoC. One embodiment of a core+wrapper combination comprises distinct input and output cells within the wrapper, and a separate FRM. Another embodiment may embed the input and output cells within the FRM. The FRM may be implemented with, for example, a field programmable logic array (FPLA). An additional advance is realized by providing a number of spare leads in the signal paths network that interconnects the various SoC elements.

50 Claims, 10 Drawing Sheets

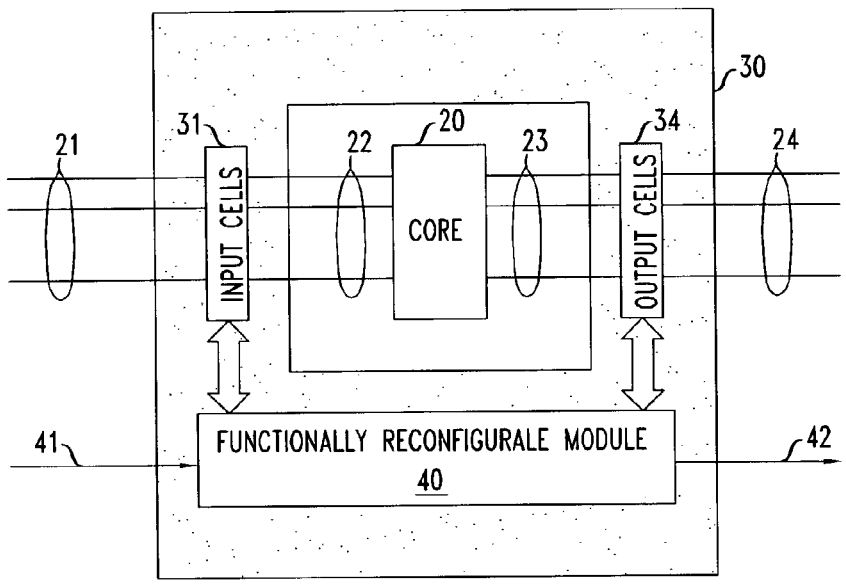
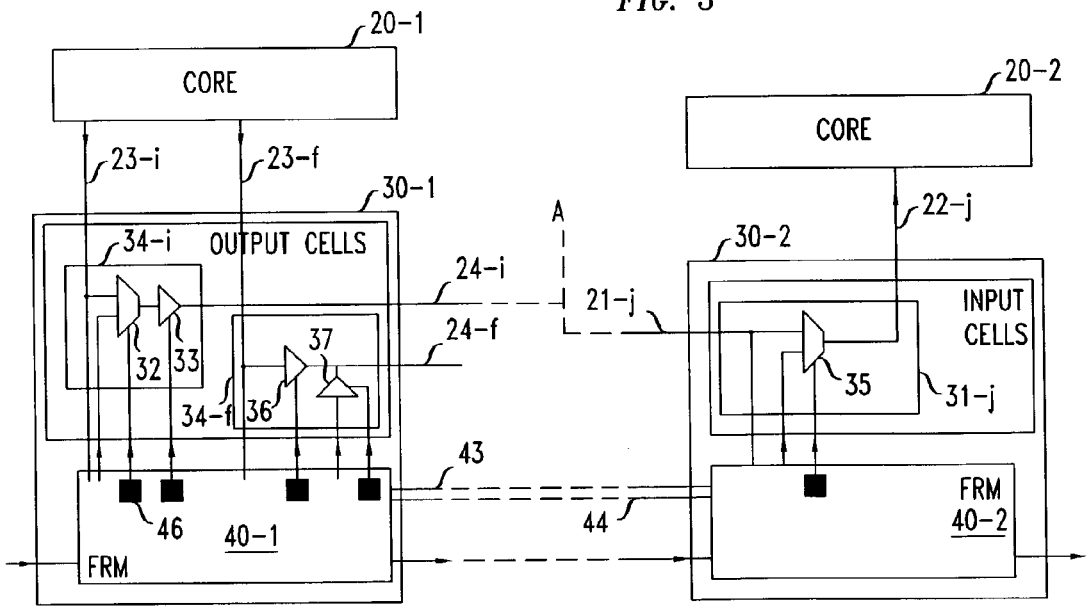

LEGEND: ● = SWITCH

F(M(S),N(U))=G(S,U)

BREAKPOINT:
OUTPUT=S AND V

RECONFIGURABLE FABRIC FOR SOCS USING FUNCTIONAL I/O LEADS

BACKGROUND OF THE INVENTION

This invention relates to integrated circuits and, more particularly to an integrated circuit design approach.

The design of highly complex systems within a single integrated circuit is the new challenge to the integrated circuit design community. Driven by the need for high speed and large throughput applications, it has become quite evident that the design of very large-scale integrated circuits (VLSI) can be undertaken most advantageously only by adopting a policy of reuse at a cores level. Such reuse not only permits the effective design of very complex chips, but also offers such designs in very short time. In such a re-use approach, cores that are available from previous in-house designs, or from other commercial concerns, are interconnected to form a system on a chip (SoC), in a manner not unlike the way integrated circuits are interconnected on printed circuit wiring boards. Cores are available that implement CPUs, memories, network controllers, UARTs, etc. The advantage of using cores lies in the fact that these designs have been perfected in the past (debugged and thoroughly verified) and can be assumed to be operationally correct.

It is noted that some SoC designs require functionalities that are not available by simply interconnecting available cores and, therefore, those designs include one or more specially designed user-defined logic (UDL) modules. A UDL module may contain more than mere combinatorial logic.

In the context of this disclosure, the term "cores" designates pre-packaged design modules that a designer of an integrated circuit employs, usually without any changes. A UDL module represents functional elements of an integrated circuit design that combine with the cores to form the integrated circuit's functional circuitry.

Alas, the use of cores to design an integrated circuit is not sufficient when it comes to verifying a completed integrated circuit design, because the system's global design or an existing UDL might contain errors, interfaces between the cores might not have been accounted for in a proper way in the initial design phase, or the layout might not have been designed properly.

The myriad sources of possible manufacturing defects in SoCs make it imperative that the SoCs should be testable. Often, cores have an associated suite of tests that is available so, if a core within an SoC can be accessed, at least the cores can be tested. That makes the testing of even very highly complex designs feasible, provided that a mechanism is incorporated for accessing each of the embedded cores in an SoC design.

The notion of a wrapper arose to provide precisely this capability. A wrapper comprises circuitry that surrounds a core, and which is accessible (though not necessarily directly) from outside the SoC. It is said that a wrapper "surrounds" a core because all inputs and output of a core are accessible only by going through the wrapper. Put another way, a wrapper has inner I/O leads to which the associated core's I/O leads are connected, and outer I/O leads. Each inner I/O lead has a corresponding outer I/O lead. A wrapper typically has several additional outer I/O leads.

FIG. 1 depicts the structure of a wrapper that comports with the IEEE proposed P1500 standard. See, for example, http://grouper.ieee.org/groups/1500/. It includes a wrapper 10 that wraps, or encompasses, core 20 in the sense defined above. A wrapper serial input 18 is applied to a shift register-like set of wrapper input-interface cells 13, from whence it is applied to a serial register-like set of wrapper output cells 14. The serial output of set 14 is applied to multiplexer 15. The serial input is also applied to multiplexer 15 (a different input lead) through bypass register 17, which typically provides a one-bit delay. Lastly, the serial input is applied to wrapper control element 11 that comprises a wrapper instruction register 11-1 that receives the serial input and applies the information that is stored in instruction register 11-1 to controller 11-2. Actually, register 11-1 is both a serial input/output register and a parallel input/output register. The parallel input to register 11-1 is applied from outside wrapper 10 via bus 12, and the serial output is applied to a first input of multiplexer 16. The output of multiplexer 15 connects to a second input of multiplexer 16, and the output of multiplexer 16 forms the serial output of wrapper 10. Controller 11-2 controls the input cells set, the output cells set, and multiplexers 15 and 16.

An external tester applies test vectors for a core at a set of pins of the SoC. The paths between these pins and the wrapper of the core is referred to as a Test Access Mechanism, or TAM. The TAM is user-defined and it is not part of the P1500 standard.

S. Koranne, in "A Novel Reconfigurable Wrapper for Testing of Embedded Core-Based SOCs and its Associated Scheduling Algorithm," volume 21 of *Journal of Electronic Testing*, pages 51–70, Kluwer Academic Publishers, September 2002 addresses the issue of TAM optimization in conjunction with efficient scheduling of tests on system level. Koranne observes that since the number of test pins that are available at ports of the integrated circuit (IC) is limited, test bits ought to be partitioned in order to reduce the total test cost. Observing that previous approaches have designed test wrapper around cores assuming a static width of TAM, Koranne describes an approach the number of TAM bits that are processed in parallel by the wrapper can be changed, rather than being fixed. Koranne terms this a "reconfigurable wrapper design."

Regardless of what Koranne calls his approach, it remains an approach that offers control only over the number of TAM bits that are employed in the testing of a core within an SoC. At best, it can be said that such control is control over a parameter of the TAM. The functionality of the wrapper is unaltered by anything that Koranne suggests.

However, the complexity of SoC designs makes it highly advantageous to adopt an architecture, and a design paradigm, that employs an approach that exercises control over the functionality of the wrapper and, consequently, is able to affect the functionality of the core+wrapper combination.

SUMMARY

A significant advance in the art is realized with a wrapper that comprises a functionally reconfigurable module (FRM) that is capable of affecting the operational functionality of the wrapper and that, consequently can affect the operational functionality of a designed SoC. One embodiment of a core+wrapper combination comprises distinct input and output cells within the wrapper, and a separate FRM. Each output of the associated core is connected to an output cell within the wrapper, and to the FRM. The output cells deliver signals to output leads of the wrapper. Each input to the wrapper is connected to an input cell and to the FRM, and the input cells deliver their outputs to input leads of the associated core. Another embodiment may embed the input and output cells within the FRM. The FRM may be implemented with, for example, logic similar to a field programmable logic array (FPLA), whose functionality is determined by the contents of a configuration memory.

The exceptional flexibility of the FRM module, results from (a) its reconfigurable nature, (b) the interconnection between the wrapper, the associated core, and the input leads of the wrapper, and (c) the fact the FRM can implement combinatorial with, and without memory.

An additional advance is realized by providing a number of spare leads in the signal paths network that interconnects the various SoC elements. Illustratively, the number of leads that interconnect each wrapper to another wrapper is increased with spare leads that are connected to the FRM, and which can be used for testing, monitoring, correcting the design, correcting manufacturing defects etc.

BRIEF DESCRIPTION OF THE DRAWINGS

FIG. 2 shows a wrapper design in accord with the principles of this invention;

FIG. 3 shows the structure of output and input cells, and the use of spare lines between FRMs;

DETAILED DESCRIPTION

Figure 1:
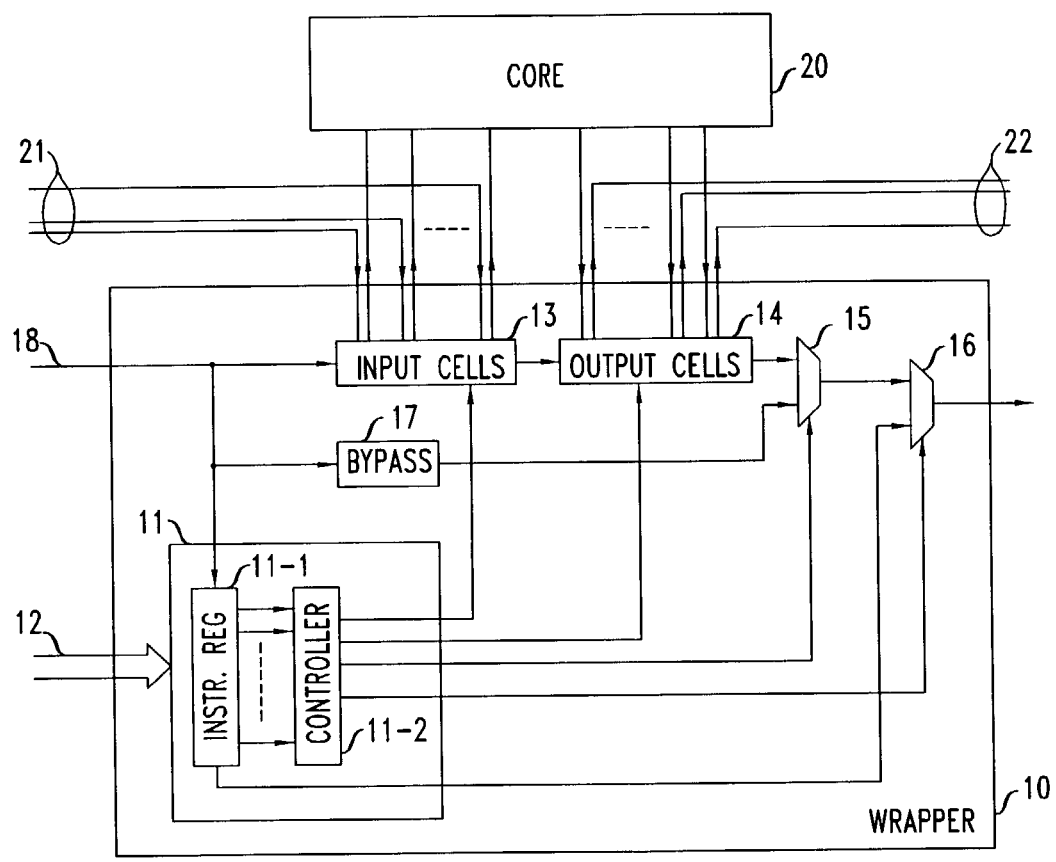
FIG. 1 shows a wrapper design that comports with the proposed P1500 standard.

FIG. 2 presents a block diagram of a core 20 connected to wrapper 30 that is constructed in accord with the principles disclosed herein. The core 20 is used in a simple instance of a "system on a chip," or SoC. The SoC communicates with the core 20 via input signals 21 and output signals 24, both of which go through the wrapper 30 on their way to and from the core. Basically, input leads 22 of core 20 are connected to inner (output) leads of wrapper 30 that, within wrapper 30, are connected to output terminals of input cells set 31. Outer input leads 21 are connected to input terminals of input cell set 31, thereby enabling signals to pass through wrapper 30 to core 20. Similarly, output leads 23 of core 20 are connected to inner (input) leads of wrapper 30 that, within wrapper 30, are connected to input terminals of output cell set 34. Output terminals of output cell set 34 extend outside wrapper 30 to outer output leads 24. Additionally, wrapper 30 includes a functionally configurable module (FRM) 40 that is coupled to cell set 31 and cell set 34. The FRM may be implemented with, for example, with a field programmable array, and some control circuitry, where the functionality of the field programmable array is determined by the contents of a configuration memory that is part of the field programmable array. FRM 40 also includes a serial input 41 (perhaps a multi-lead bus) and a serial output 42 that, when daisy-chained through the set of wrappers in an SoC, enables all of the FRMs in the SoC to be configured through the serial connection. Although not explicitly shown, FRM 40 also includes leads through which control signals can be applied to direct the functionality and operation of the wrapper. Thus, in accord with the principles disclosed herein, a flexible SoC is created with a REFAB (reconfigurable fabric), which is a wrapper that comprises of a collection of input cells, output cells, and an FRM. The FRM is composed substantially nothing but field programmable logic and memory that configures the logic and the interconnections within the FRM. By substantially we mean that more than 95 percent of the FRM's "real estate" is devoted to the field programmable logic and associated configuration memory elements.

It may be noted that input cells set 31 and output cells set 34 may be embedded within FRM 40, but for sake of exposition, all of the FIGS. in this disclosure show the cells as distinct elements.

FIG. 3 shows the structure of the output and input cells through an illustration of an SoC where output lead 23-i of core 20-1 needs to be connected to input lead 22-j of core 20-2. In accord with the wrapper paradigm disclosed herein, this connection is effected by passing through the wrapper of core 20-1, i.e., wrapper 30-1, and by passing through the wrapper of core 20-2, i.e., wrapper 30-2. More specifically, lead 23-i connects to output cell 34-i in wrapper 30-1, exits cell 34-i on lead 24-i, connects to lead 21-j of wrapper 30-2, enters input cell 31-j, and exits input cell 31-j on lead 22-j.

Output cells within a wrapper are constructed as shown for cell 34-i. That is, a cell comprises a two-input multiplexer 32 that has one input connected to an output lead of the associated core. That same output lead of the core is also connected to the FRM of the wrapper, that is, FRM 40-1. The second input of multiplexer 32 is received from the FRM. The output of multiplexer 32 is coupled to an outer lead of the wrapper 30 through three-state driver 33. Driver 33 is characterized by a high output impedance when the control signal is low (logic level "0"). When the control signal is high (logic level "1"), the output of driver 33 merely equals its input. Configuration memory bits within FRM 40-1 (the solid squares in FIG. 3), such as configuration bit 46, control multiplexer 32 and driver 33.

Alternatively, output cells within a wrapper may be constructed as shown for cell 34-f. That is, a cell comprises a tri-state driver 36 that, under control of a configuration bit, is adapted to output the signal of core output lead 23-f to wrapper output lead 24-f, and a tri-state driver 37 that, under control of a second configuration bit, is adapted to output a signal generated within the wrapper to the same output 24-f. Of course, the configuration bits are never set so that both of the drivers concurrently pass a signal to their respective outputs.

Input cells within a wrapper are constructed as shown for cell 31-j with, for example, two-input multiplexer 35. An outer input lead of the wrapper is connected to one input of multiplexer 35 and to the associated FRM. A second input to multiplexer 35 is received from the FRM, and the output of multiplexer 35 is connected to an input lead of the associated core. As with cell 34-i, configuration bits within the FRM control the state of multiplexer 35.

FIG. 3 presents an additional feature that confers significant advantages to the SoC fabric architecture disclosed herein, and that feature is spare lines 43 and 44 that connect the FRM of wrapper 30-1 to the FRM of wrapper 30-2. FIG. 3 shows only two spare lines, but it should be kept in mind that the FIG. 3 illustration may be depicting fewer than all of the connections between wrapper 30-1 and 30-2, and that there also may be connections to other wrappers, and to UDL modules.

Clearly, the number of spare lines is a design choice. It is expected, however, that the number of spare lines between two wrappers will be directly proportional—though not necessarily in a mathematically precise relationship—to the number of signal lines that connect those wrappers in a particular SoC design. Advantageously, a computationally developed number of spare leads is rounded up to the next integer.

To illustrate different output cell designs, FIG. 3 depicts two output cells for wrapper 30-1. The first (cell 34-i) comprises a multiplexer 32 followed by a three-state driver 33. The second (cell 34-f) comprises a three-state driver 36 and a three-state driver 37 that have their outputs coupled to the output of the cell. In the first cell, multiplexer 34 selects either a signal from core 20-1 or a signal from within FRM 40-1, and driver 34 either passes that signal to the cell's output or is disabled and thus presents a high impedance to the cell's output. In the second cell, only one of the drivers is enabled at a time, and thus the cell presents either a high impedance at its output, or the signal of the enabled driver, i.e., either a signal from core 20-1, or a signal from within FRM 40-1.

Figure 4:
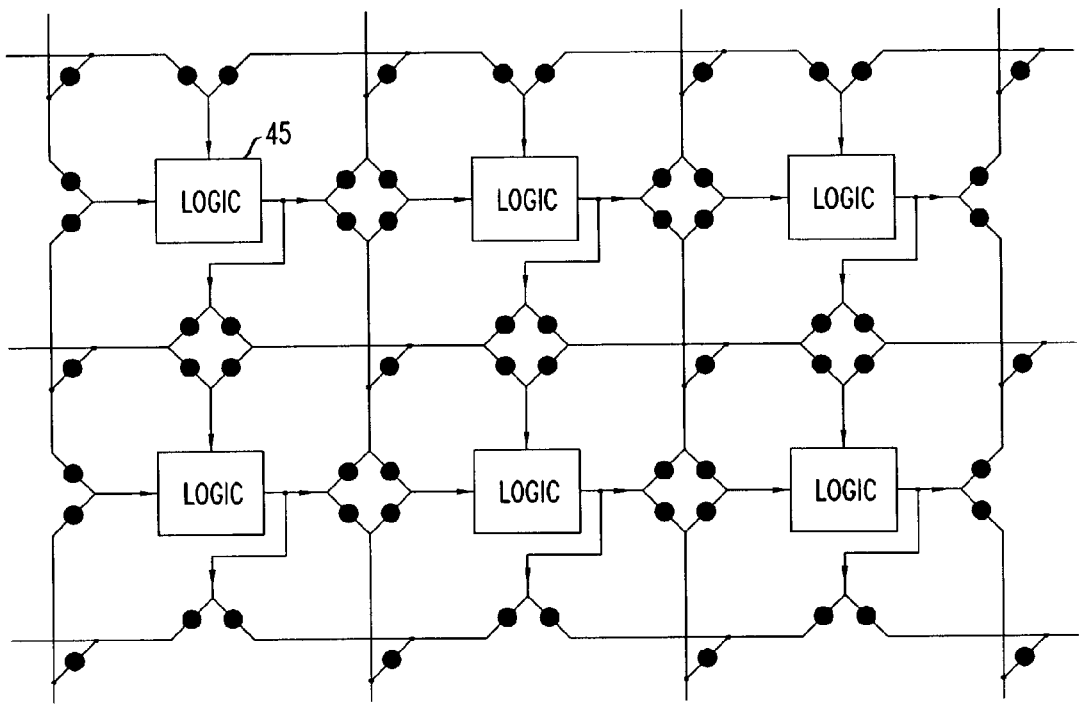
FIG. 4 illustrates the structure of a FPLA that may be employed in the FIG. 3 design.

FIG. 4 presents the structure of one FPLA that may be used in implementations of FRM 40. The lines in FIG. 4 represent multi-lead busses, and the solid black dots represent sets of switches. Each of the switch sets has an associated configuration bit, but for sake of clarity it is not shown in FIG. 4. The design of the FIG. 4 FPLA is fairly conventional. It may be noted, however, that the placement of the switch sets permits almost limitless connection arrangements to be configured for delivering signals to logic elements 45 of the array of logic elements. Each logic element has one input bus that obtains signals from a horizontal bus, and one input bus that obtains signals from a vertical bus. Each logic element has one output bus that can be applied to a horizontal bus, or to a vertical bus (or to both). Logic blocks 45 may be implemented in numerous ways. One way is to have each logic block 45 consist of a programmable memory. These memories, which are programmed through the serial input (41), can implement any desired logic function. For sake of simplicity, the serial connection of the various configuration bits and memories within FRM 40 are not shown in FIG. 4. In short, the FRM has cells of programmable logic and programmable interconnect network able to establish links among the logic cells, the inputs and outputs of the wrapper, including the spare inter-wrapper connections. The functions of the cells and the connections of the programmable interconnect are set by loading a configuration memory within the wrapper.

Figure 5:
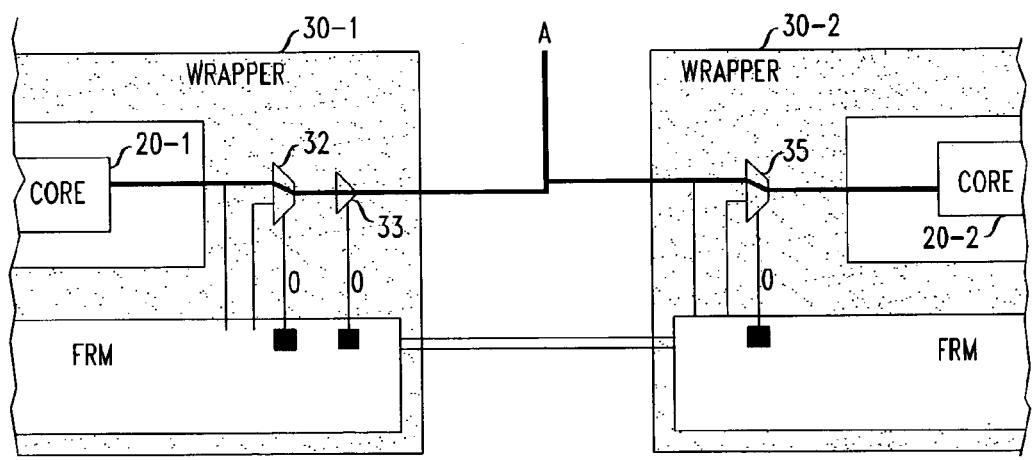
FIG. 5 shows two cores and their normal interconnection via their associated wrappers.

The following sections describe some of the capabilities inherent in the FIG. 2 structure, where FIG. 5 shows the normal operating condition.

In FIG. 5, an output lead of core 20-1 is applied to multiplexer 32 of an output cell in wrapper 30-1. Responsive to a "0" control signal, multiplexer 32 selects the signal of that lead, and applies it to driver 33. Responsive to a "0" control signal, driver 33 is enabled, and that extends the signal to outside wrapper 30-1, where it is connected to wrapper 30-2, and possibly to other wrappers and/or UDLs. The latter is shown by the line that is terminated by the letter "A." Within wrapper 30-2, the signal is applied to an input cell and, more particularly, to multiplexer 35, where it is selected in response to a "0" control signal. The output of multiplexer 35 is applied to core 20-2.

Inverting an Output Signal

Figure 6:
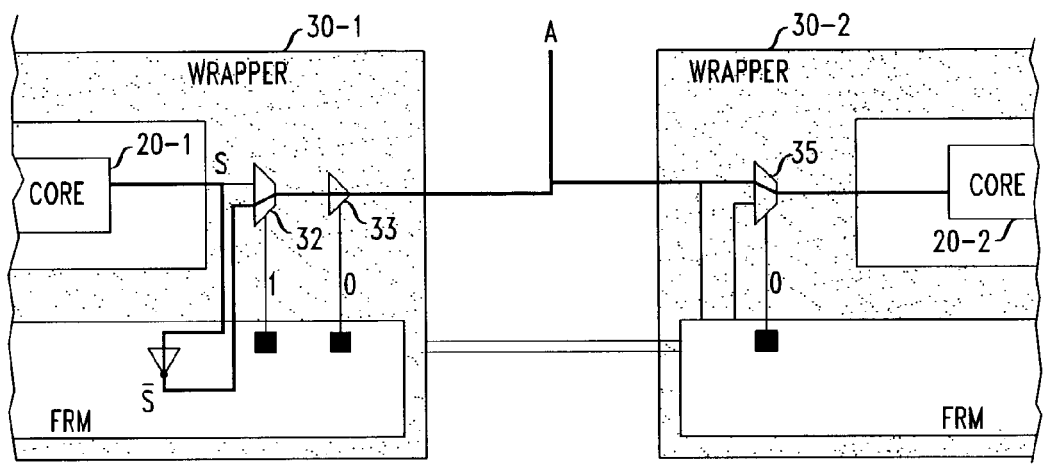
FIG. 6 shows configuring a wrapper to invert a core's effective output.

It is possible that the output signal of a core is not what is desired for a particular purpose. This situation might be expected to occur not infrequently, since the design (and the layout) of a core received from a third party, for example, core 20-1, was completed at an earlier time. FIG. 6 presents an arrangement for inverting an output signal s of core 20-1 to form a signal s̄. All that is required is to configure (i.e., create) an inverter within the FRM of wrapper 30-1 that is connected between the output of wrapper 30-1 and the second input of multiplexer 32, and to configure a "1" control signal to multiplexer 32. The signal that is consequently applied to driver 33 is s̄, and the desired end result is thus achieved, as shown by the bold polylines in FIG. 6.

Inverting an Input Signal

Figure 7:
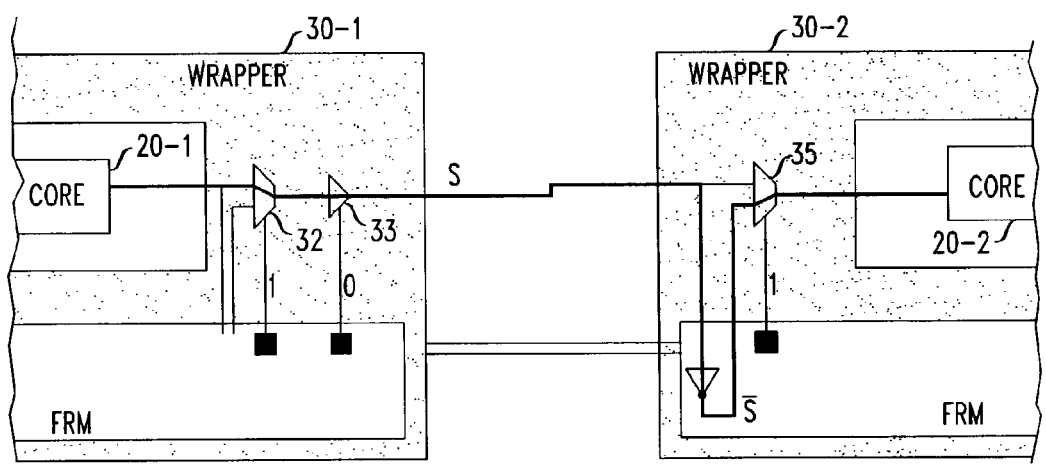
FIG. 7 shows configuring a wrapper to invert a core's effective input.

It is possible that the output signal of a core is as it should be, considering the various other wrappers and UDL modules to which the output must be applied, but relative only to core 30-2, that signal, s, is incorrect, and what is needed is signal s̄. FIG. 7 presents an arrangement for inverting an input signal to core 20-2. All that is required is to configure an inverter within the FRM of wrapper 30-2 that is connected between the input of wrapper 30-2 and the second input of multiplexer 35, and to configure a "1" control signal to multiplexer 35. The signal that is consequently applied to core 20-2 is s̄, and the desired end result is thus achieved, as shown by the bold polylines in FIG. 7.

Fixing a Crosstalk Problem or Bypassing a Short Between Two Wires

It is possible that, although a design is logically correct, the actual layout of a chip results in two signals that are routed too closely to each other and, consequently, adversely affect each other. This crosstalk problem is typically resolved by altering the layout in a subsequent design cycle. That, however, is very costly. A similar problem arises when a manufacturing defect (a "short") incorrectly connects lines that should not be connected.

Figure 8:
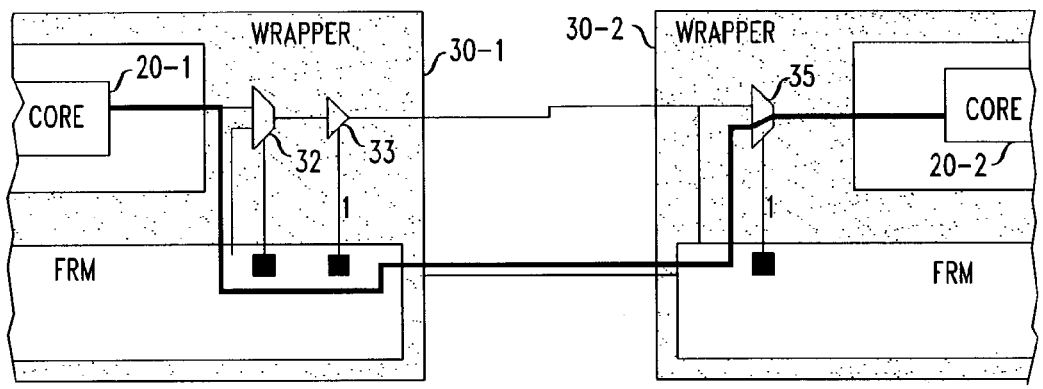
FIGS. 8, 9, and 10 show configuring a spare lead to overcome a crosstalk problem, a "open" problem, and a "short" problem, respectively.

The FRM disclosed herein, coupled with the advantageous use of the spare lines between connected wrappers solves these difficulties with ease, as demonstrated in FIG. 8 for the crosstalk problem. To illustrate, assume in connection with FIG. 8 the discovery that the signal line between driver 33 of wrapper 30-1 and multiplexer 35 of wrapper 30-2 picks up too much crosstalk. In accord with the principles disclosed herein, this problem is overcome by configuring wrapper 30-1 so that the output signal of core 20-1 that would otherwise extend from driver 33 (to the crosstalked line) extends, instead, through one of the spare line that connect wrapper 30-1 to wrapper 30-2. The solution is completed by configuring wrapper 30-2 to present the signal that arrives at the spare line to the second lead of multiplexer 35, and to configure a "1" control signal at multiplexer 35. The result is that the signal that previously flowed through the line from driver 33 to the top input of multiplexer 35 now flows through a spare line and the bottom input of multiplexer 35. Since the spare line is necessarily farther away from the line that creates the offending crosstalk, the problem is ameliorated. This is shown by the bold polylines of FIG. 8. Note that the control signal of multiplexer 32 is not specified—because it is irrelevant ("don't care").

Figure 9:
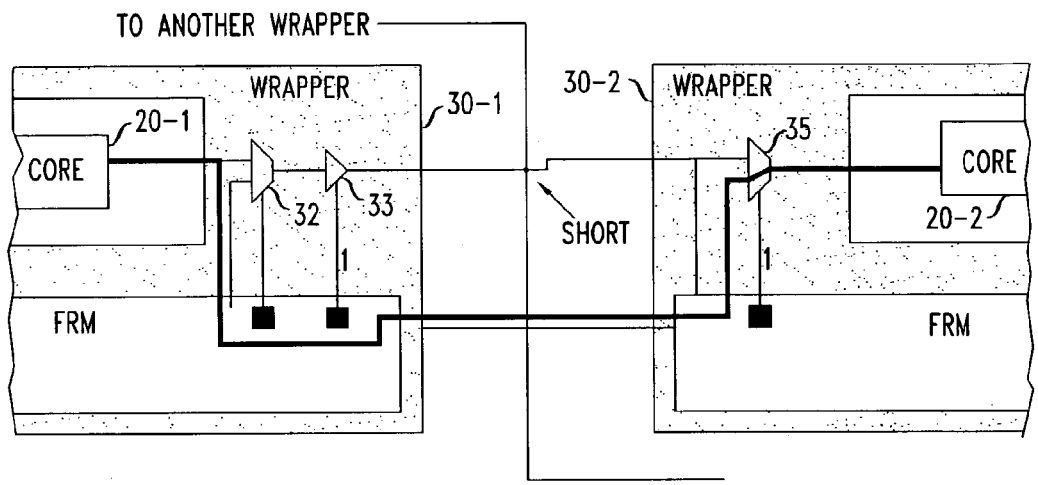

The solution for bypassing a "short" may be identical to that of the crosstalk problem, as demonstrated by FIG. 9.

Fixing an "Open Circuit"

Figure 10:
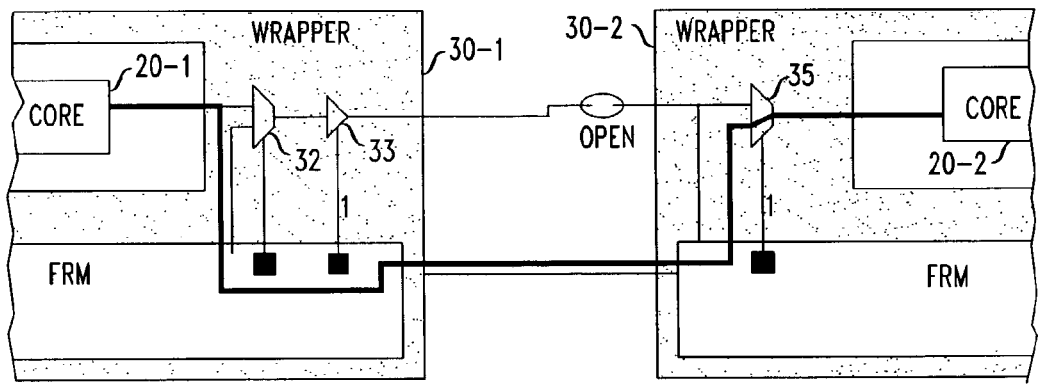

It is also possible that a necessary connection is not made, either because of a layout error, or a manufacturing defect, resulting in an "open circuit." This defect also can be corrected quite easily, as demonstrated in FIG. 10.

It may be noted that the ability to fix manufacturing defects, such as shorts and opens, can be exercised by the manufacturer of the SoC when manufactured SoCs are tested, or by the customer/user of the SoC at a later time. This is a very powerful tool for enhancing manufacturing yield and, therefore, represents a major commercial advantage of the disclosed wrapper architecture.

Fixing A Design Error

As indicated above, a designed SoC may comprise UDL modules in addition to cores. Since the UDL modules are designed specifically for the SoC, it is possible that UDL modules will contain design errors.

Figure 11:
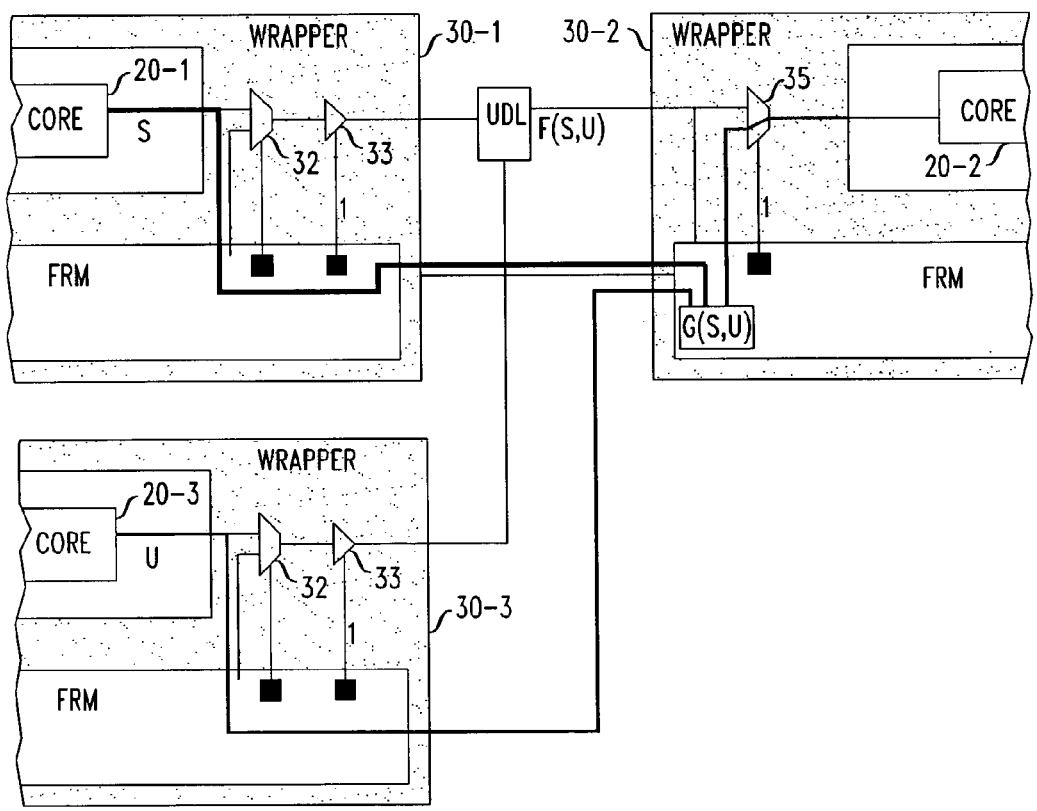
FIGS. 11, 12, and 13 show different approaches for fixing a design problem in a UDL by configuring the FRMs within one or more wrappers.

FIG. 11 illustrates a situation where the signal that is needed to be applied to core 20-2 is G(s,u), where s is an output signal of core 20-1, and u is an output signal of core 20-3. The design sets out to obtain the function G(s,u) from UDL module 50 by applying signal s to UDL 50 via elements 32 and 33 within wrapper 30-1, and signal u to the UDL 50 via elements 32 and 33 within wrapper 30-3. However, it may turn out that because of a design error, UDL module 50 actually develops a different signal, i.e., F(s,u). This error is corrected, according to the FIG. 11 embodiment, by configuring wrapper 30-1 to pass signal s to one of the spare lines that is extended to wrapper 30-2, and by configuring wrapper 30-3 to pass signal u to a spare line that connects to wrapper 30-2. Wrapper 30-2 is configured to create the correct function, G(s,u), in response to signals arriving at the spare lines, and to apply the developed G(s,u) signal to the second input of multiplexer 35. Configuring wrapper 30-2 to apply a "1" control signal to multiplexer 35 completes the design error fix.

It may be mentioned that the FIG. 11 fix requires a spare line between wrapper 30-3 and wrapper 30-2, as well as between wrapper 30-1 and wrapper 30-2, even though there may not be any other signal connections between wrapper 30-2 and these other wrappers. Of course, there is no reason to prohibit the incorporation of such spare lines in an SoC design.

Figure 12:
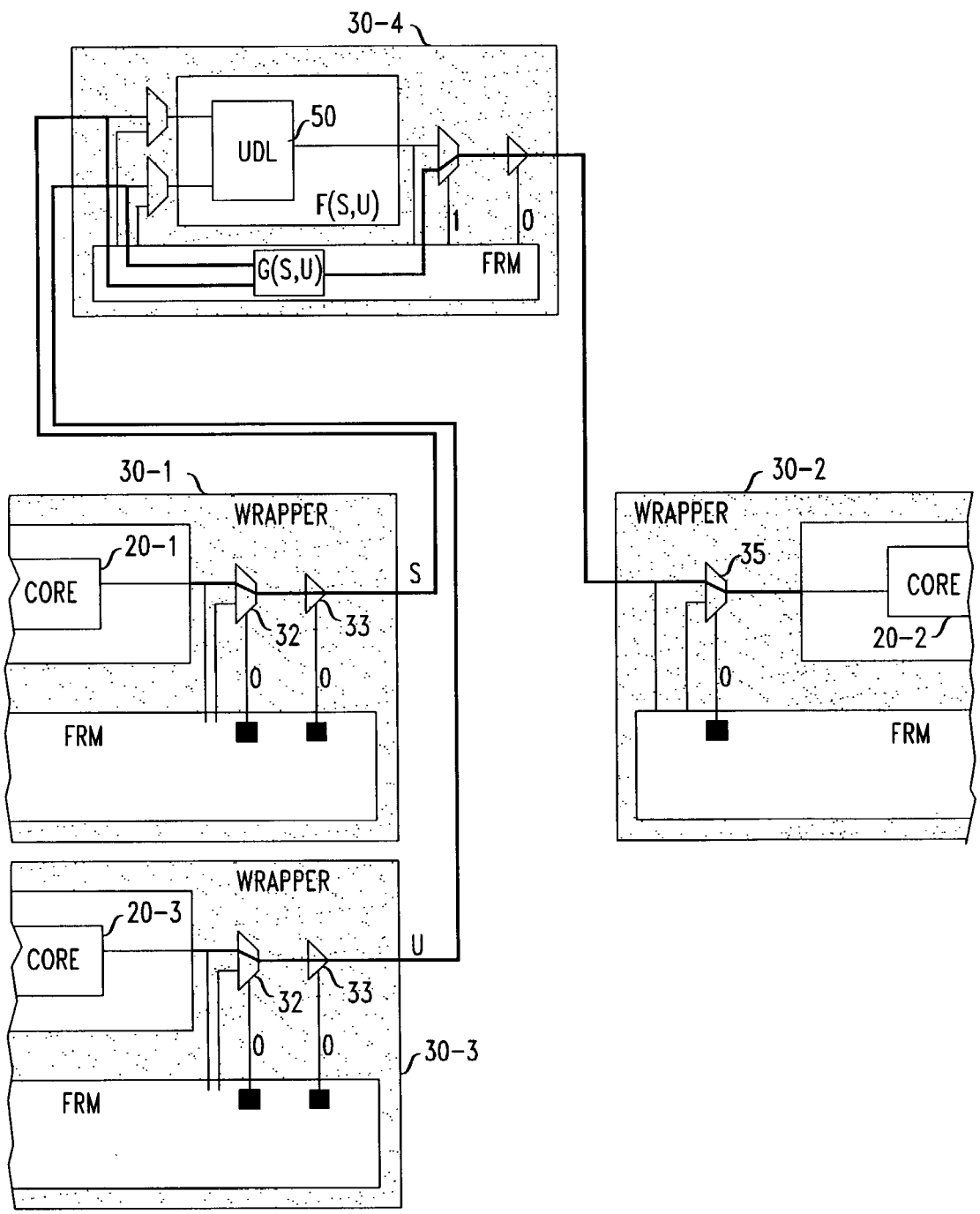

Another solution is presented in FIG. 12, which is based on the observation that there is no reason to prohibit the creation of a wrapper to encompass UDL 50, for example, wrapper 30-4. That allows the creation of function G(s,u) within wrapper 30-4 along the lines explained above.

Figure 13:
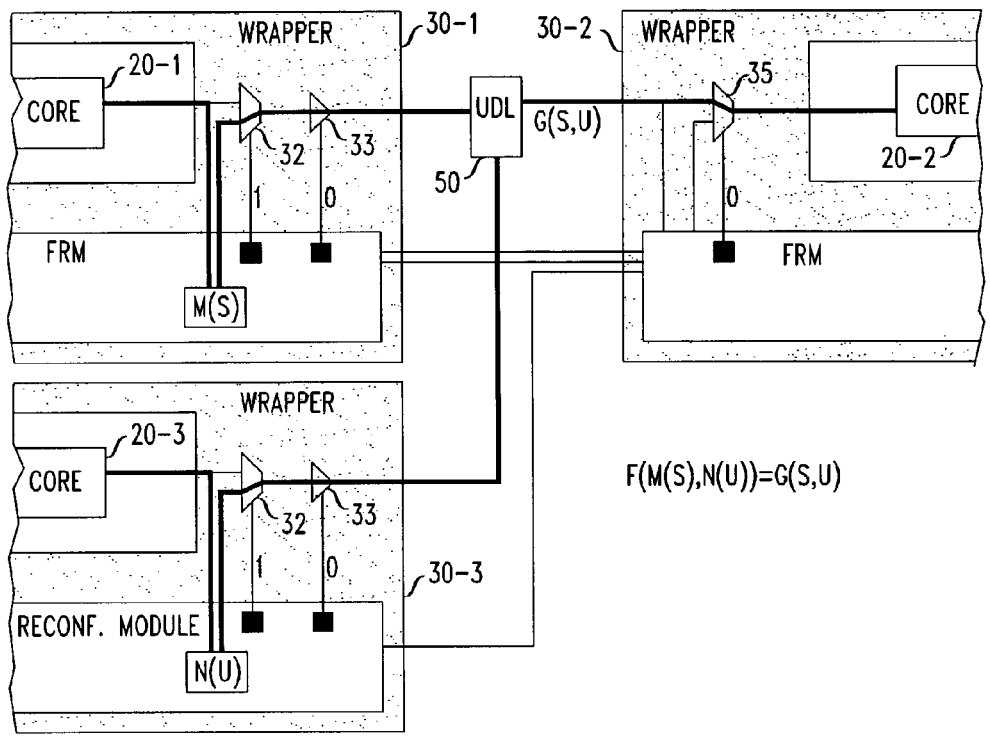

Another solution that comports with a strict rule that spare lines are to be included only as an incremental addition to signal lines between wrappers is shown in FIG. 13, where wrapper 30-1 is configured to develop a signal that corresponds to M(s), to apply that signal to the second input of its multiplexer 32, and to pass that signal to its driver 33. Similarly, wrapper 30-2 is configured to develop a signal that corresponds to N(u), to apply that signal to the second input of its multiplexer 32, and to pass that signal to its driver 33. The design problem is overcome when functions M(s) and N(u) are selected so that F(M(s),N(u)) equals G(s,u).

There are various circumstances where it would be desirable to have the above discussed fixes that overcome design and manufacturing problems be permanently incorporated into a SoC. In accord with the principles disclosed herein this is easily accomplished with an embedded ROM in the FRM. Once a SoC is tested, and the wrapers configured to overcome the design or manufacturing problems, the ROM can be "burned-in" with data to configure the appropriate configuration bits when power is applied to the SoC.

Debugging

To detect the presence and the cause of errors, one needs to be able to debug the SoC. Advantageously, the disclosed architecture offers powerful debugging capabilities. That includes inserting breakpoints, effecting state dumps, assertion checking, event counters, etc.

Figure 14:
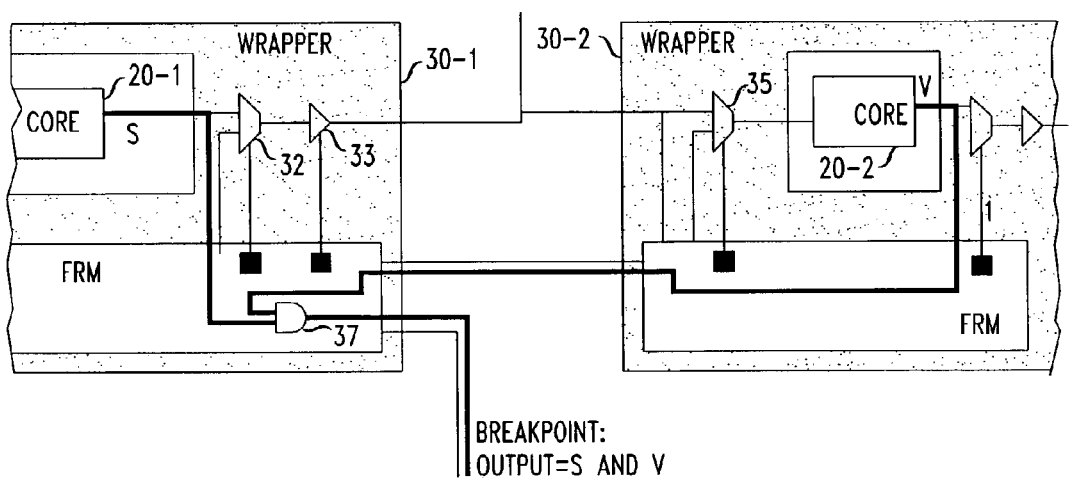
FIG. 14 presents one example of a monitoring function that can be configured in FRMs within one or more wrappers.

FIG. 14 illustrates the creation of a breakpoint signal that assumes logic level 1 when a particular output signal, v, of core 20-2 is "1" and output signal s of core 20-1 is "1." This is achieved, illustratively, by configuring wrapper 30-2 to pass signal v to a spare line that connects wrapper 30-2 to wrapper 30-1, configuring wrapper 30-1 to create an AND gate, to pass signals v and s to the AND gate, and to output the gate's output to a spare line that connects to wherever the breakpoint information is to be sent. The current state-of-the-art does not provide any SoC debug mechanism that allows establishing such breakpoints, or combining signals from different cores at run-time. Alternatively, the wrapper 30-1 can implement an event counter; for example, to count the number of times the condition S·V=1 occurs within a specified time interval, etc. This involves merely the addition of a counter that is responsive to the output of gate 37. The final value of the counter can be read by configuring a serial register including the counter and scanning out the state of the counter. It is noted that these are but a few examples of debug features. Other examples include state dumps, assertion checking, monitoring, error injecting, etc. For the experienced debug engineer, the reconfigurability of the wrappers, coupled with the use of the spare signal lines between wrappers, provides an unmatched flexibility for debugging the SoC design.

Core Testing

Figure 15:
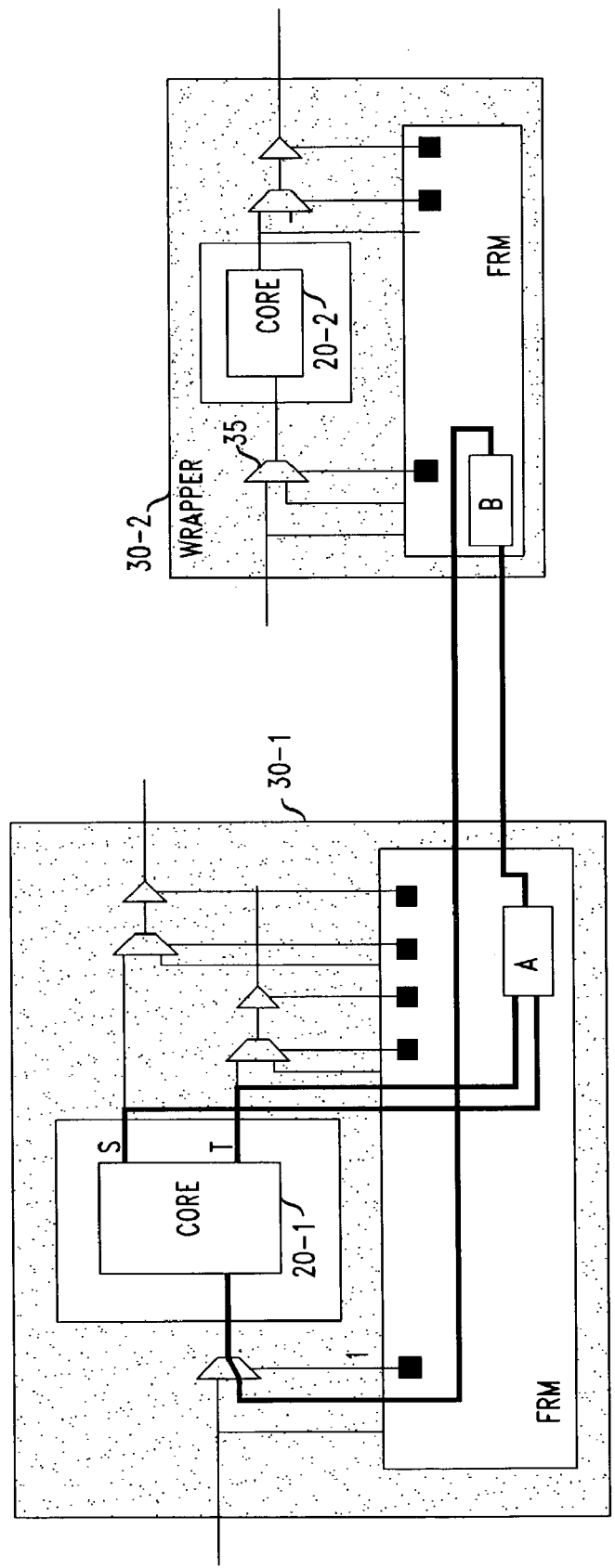
FIG. 15 illustrates the testing of cores, and also that any function that is needed to be implemented can be implemented by using the collective resources of the FRMs within an SoC.

Many cores contain built-in self-test (BIST) hardware that can generate test vectors to test the core, and can also analyze the response obtained from the core to determine whether it contains manufacturing defects. Conventional BIST logic is typically used only once for manufacturing test, but still resides in the circuit for its entire lifespan. From the standpoint of this invention, this is a wasted chip "real estate." In SoC designs in accord with the principles disclosed herein, self-test hardware is configured into FRM of the wrapper only when testing is desired. To test a core, the FRM-resident self-test hardware (FRM-RSTH) generates signals to be applied to the inputs of the test under test, and analyzes its output signals. When testing completes, the FRM may be reconfigured for other purposes. Of course, it is possible that the self-test hardware requires resources in excess to those that are available within the FRM associated with the core. That presents no problem, however, because hardware from FRMs of other wrappers can be incorporated into the FRM-RSTH through the use of spare leads, disclosed above. This is illustrated, for example, in FIG. 15, were blocks A and B combine to provide the desired test function for the core under test 20-1. Note that the tri-state drivers in the wrapper 30-1 of the core under test 20-1 are disabled to isolate the core from the rest of the SoC.

It is noted that the FRM can be configured to implement the proposed P1500 standard.

Many cores are tested with vectors supplied by an external tester, and brought to the core under test via a TAM. In a SoC designed in accordance with the principles disclosed herein, all the logic to generate the required vectors for a core can be configured in the wrapper of that core, and in other wrappers if required. In this way the TAM can be dispensed with.

UDL Testing

Figure 16:
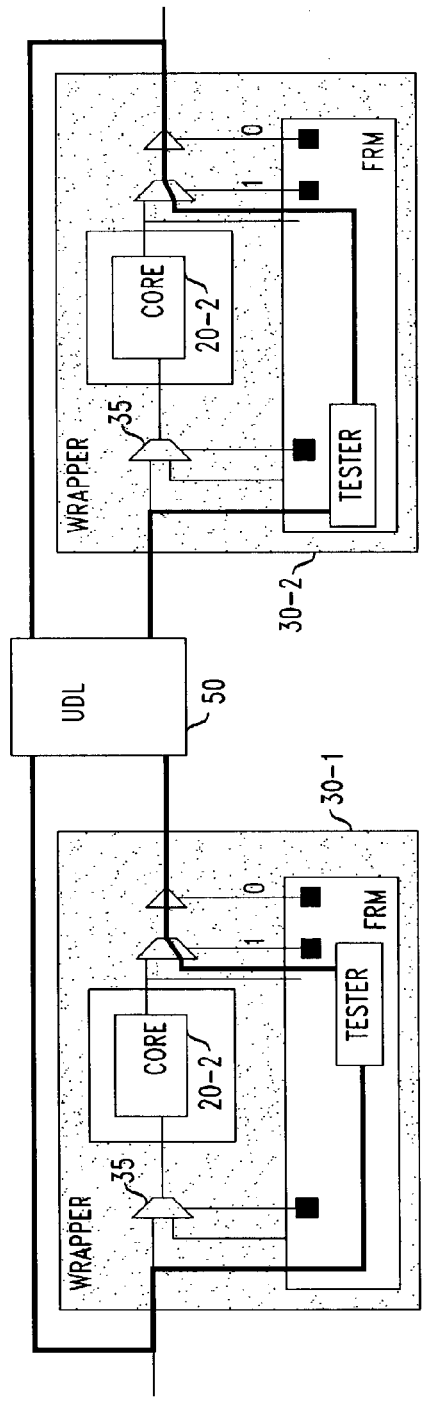
FIGS. 16 and 17 illustrate testing of UDLs, and interconnections by configuring testers within the FRMs of one or more wrappers.

The disclosed architecture is able to not only verify the operational integrity of cores, but also the operational integrity of UDL modules. FIG. 16 illustrates one such test arrangement, where wrapper 30-1 is configured with a tester, and wrapper 30-2 is configured with a tester. Both testers apply a test sequence to the inputs of UDL 50, and both testers can observe the outputs of UDL 50.

Interconnect Testing

Figure 17:
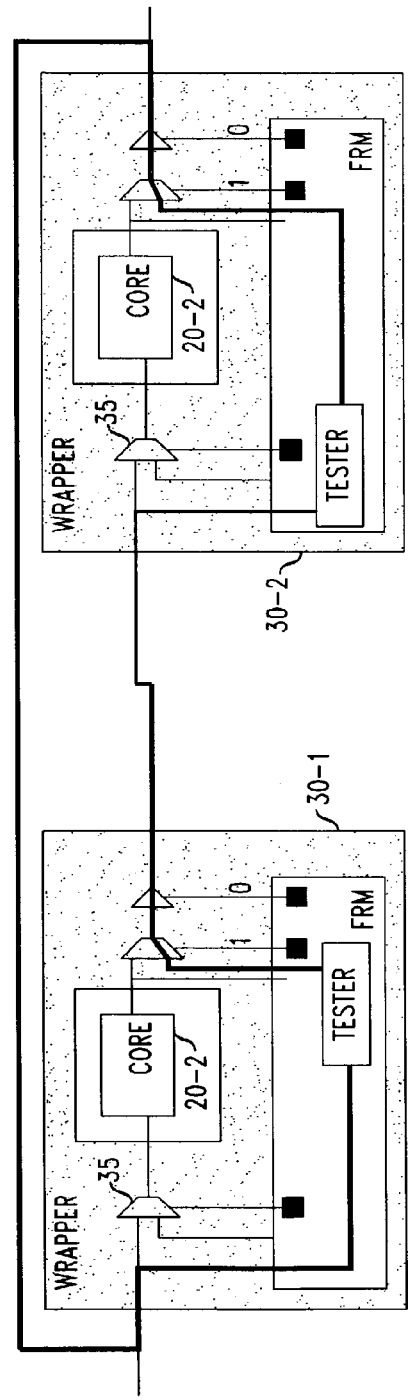

FIG. 18 shows that the interconnect between cores can be also tested in a manner that is similar to that of FIG. 17.

The above disclosed some of the capabilities inherent in the use of an FRM in core+wrapper combinations. Skilled artisans would readily recognize many other possibilities. To illustrate, functional circuitry that is needed for one core, or that is needed for the interaction of two different cores need not be limited to realizations within a single wrapper, or even within the wrappers that are associated with the relevant cores. They can utilize resources of different wrappers, as illustrated in FIG. 17. That increases the potential effectiveness of the entire set of FRMs that are included in a SoC design and, in turn, this may lead to smaller individual FRMs than would otherwise be advisable to have.

The invention claimed is:

1. A device comprising:
a functional circuit having a set of input and output leads; and
an REFAB having a number of outer input leads and a corresponding number of inner output leads, and a number of inner input leads, and a corresponding number of outer output leads;
where said output leads of said functional circuit are connected to said inner input leads of said REFAB, and said input leads of said functional circuit are coupled to said inner output leads of said REFAB.

2. The device of claim 1 where said REFAB comprises an FRM, a set of output cells interposed between each inner input lead of the REFAB and its corresponding outer output lead of the REFAB, and a set of input cells interposed between each inner output lead of the REFAB and its corresponding outer input lead of the REFAB.

3. The device of claim 2 where each output cell comprises a multiplexer having a first input connected to the associated inner input lead of the REFAB, a second input connected to said FRM, a control terminal connected to a configuration signal of said FRM, and an output coupled to said associated output terminal of said REFAB.

4. The device of claim 3 where the multiplexer output is coupled to an outer output lead of the REFAB via a three-state buffer that is responsive to a second configuration control signal from said FRM, where said driver communicates its input signal to its output when said second configuration control signal is at a first logic level, and presents a high impedance to its output when said second configuration control signal is at a second logic level.

5. The device of claim 2 where each output cell comprises a first tri-state driver having an input connects to the associated inner input lead of he REFAB, and an output that is connected to an outer output lead of the REFAB, and a second tri-state driver having an input that is connected to said FRM, and output that is also connected to said outer output lead of the REFAB, each of said drivers having a control terminal that is connected to said FRM.

6. The device of claim 5 where signals applied to said control terminals of said drivers are arranged to enable not more than one of said drivers at any time.

7. The device of claim 2 further comprising at least one configuration input lead for receiving information for said FRM.

8. An integrated circuit comprising:
at least one module that includes an REFAB, and a core circuit having I/O leads that are accessible from outside said module only by passing through circuitry within said REFAB that is coupled to I/O leads of said REFAB.

9. The integrated circuit of claim 8 where each input I/O lead of said core circuit is connected to an input cell within said REFAB that is coupled to an input I/O lead of said REFAB, and each output I/O lead of said core circuit is connected to an output cell within said REFAB that is coupled to an output I/O lead of said REFAB.

10. The integrated circuit of claim 9 where each input cell of said input cells either connects a signal from its associated input I/O lead of said REFAB to its associated I/O lead of said core circuit, or a signal from an FRM within said REFAB, based on a configuration signal is applied to said cell by a configuration memory element within said FRM.

11. The integrated circuit of claim 9 where each output cell of said output cells couples to its associated output I/O lead of said REFAB a signal from its associated I/O output lead of said core circuit, or a signal from said FRM, or presents a high output impedance to its associated output I/O lead of said REFAB, based on logic values of two configuration signals that are applied to said output cell.

12. The integrated circuit of claim 9 where said two configuration signals are applied by two configuration memory elements within said FRM.

13. An integrated circuit of claim 9 having a core where all I/O signals are accessible only via a wrapper, characterized in that said wrapper is a REFAB.

14. The integrated circuit of claim 13 where said REFAB comprises programmable logic and programmable interconnect fabric.

15. The integrated circuit of claim 14 where programming of said programmable logic is achieved through control of contents of memory modules.

16. The integrated circuit of claim 15 further comprising at least one configuration input lead for providing said content of said memory modules.

17. The integrated circuit of claim 13 wherein said REFAB comprises a field-programmable array.

18. An integrated circuit comprising:
a first core circuit having a set of I/O leads;
a first wrapper that includes an REFAB (first REFAB-wrapper) having an inner set of I/O leads that are connected to said I/O leads of said first circuit module, and an outer set of I/O leads;
a second core circuit having a set of I/O leads;
a second wrapper that includes an REFAB (second REFAB-wrapper) having an inner set of I/O leads that are connected to said I/O leads of said second circuit module, and an outer set of I/O leads; and
a connection fabric comprising leads that interconnect one or more of said outer I/O leads of said first REFAB-wrapper to one or more of said outer I/O leads of said second REFAB-wrapper.

19. The integrated circuit of claim 18 where at least one of said circuit modules is a core circuit.

20. The integrated circuit of claim 18 where one of said circuit modules is a core circuit, and the other of said circuit modules is a UDL circuit.

21. The integrated circuit of claim 18 where said connection fabric has a number of leads that couple said first REFAB-wrapper and second REFAB-wrapper that is greater than number of leads that are needed to for coupling said first circuit module and said second circuit module in absence of said first and second wrappers.

22. The integrated circuit of claim 18 further comprising configuration leads spanning between said first REFAB-wrapper, and said second REFAB-wrapper.

23. The integrated circuit of claim 18 wherein each of said core circuits is characterized by a design that was completed and verified prior to inclusion of said core in design of said integrated circuit.

24. The integrated circuit of claim 23 wherein each of said core circuits is a module having a design that was acquired, as a unit, by designer of said integrated circuit.

25. The integrated circuit of claim 23 where each of said core circuit has a test regimen for verifying operational status of the core circuit that was known prior to inclusion of said core in design of said integrated circuit.

26. The integrated circuit of claim 18 further comprising a user-defined circuit that is connected by means of said connection fabric to said first REFAB-wrapper, or to said second REFAB-wrapper, or to both.

27. The integrated circuit of claim 18 where said connection fabric includes one or more user-defined logic circuits.

28. The integrated circuit of claim 18 where said first REFAB-wrapper and said second REFAB-wrapper are programmable field arrays.

29. The integrated circuit of claim 18 where the first and the second REFAB-wrappers each form a distributed, reconfigurable, interconnection and logic fabric.

30. The integrated circuit of claim 18 where a selected one of said REFAB-wrappers is configured to substitute a signal, s, that flows over a lead in said connection fabric from a given output of the core associated with the selected REFAB-wrapper, or to a given input of the core associated with the selected REFAB-wrapper, by a signal, q.

31. The integrated circuit of claim 30 where said signal q is a function of said signal s.

32. The integrated circuit of claim 30 where said signal q is developed by a circuit module within said selected REFAB-wrapper that includes memory elements.

33. The integrated circuit of claim 18 wherein at least one of said REFAB-wrappers is configured to test its associated core.

34. The integrated circuit of claim 33 where said one of said REFAB-wrappers is configured to generate test vectors in order to test said associated core.

35. The integrated circuit of claim 18 wherein said first REFAB-wrapper is configured with first test circuitry, said second REFAB-is configured with second test circuitry.

36. The integrated circuit of claim 35 where said first REFAB-wrapper and said second REFAB-wrapper are further configured to interconnect said first test circuitry and said second test circuitry.

37. The integrated circuit of claim 18 wherein said first REFAB-wrapper, or said second REFAB-wrapper, or both, are configured to repair manufacturing defects in said integrated circuit.

38. The integrated circuit of claim 37 where said defects are in said connection fabric.

39. An integrated circuit comprising at least two interconnected modules, each including a circuit block that, relative to the circuit block's I/O leads, is encased by a wrapper that has wrapper I/O leads, the improvement characterized by said wrapper being an REFAB.

40. The integrated circuit of claim 39 where M of said wrapper I/O leads of a first of said modules are connected to M of said wrapper I/O leads of a second of said modules, where M is equal to number of leads, N, that functionality of said integrated circuit requires to be connected between I/O leads of the circuit block of said first module and I/O leads of the circuit block of said second module, plus a number of spare leads, S.

41. The integrated circuit of claim 40 where M equals N plus S, plus a number of configuration leads, C.

42. The integrated circuit of claim 41 where S is directly proportional to N.

43. The integrated circuit of claim 42 where S is a percentage of N, rounded up to an integer value.

44. The integrated circuit of claim 40 where a wrapper of said wrappers is configured to pass to one of said spare signal leads a signal that is a function of one or more signals of output leads of the wrapper's associated core.

45. The integrated circuit of claim 40 where said signal is also a function of one or more signals applied to said wrapper via said spare signal leads.

46. The integrated circuit of claim 40 where a wrapper of said wrappers is configured to develop a signal that is a function of one or more signals taken from a set consisting of (a) an input signal to said wrapper, (b) an output signal of the core associated with said wrapper, and (c) an input signal applied to said wrapper via said spare signal leads; and the developed signal is applied to a point taken from a set consisting of (i) an input cell of said wrapper, which applies a signal to an input lead of the core associated wit said wrapper, (ii) an output cell of said wrapper, which applies a signal to an output lead of said wrapper, and (iii) one of said spare signal leads.

47. The integrated circuit of claim 39 where each REFAB of a module comprises I/O cells that are interposed between said I/O leads of the module and said I/O leads of its associated circuit block, and an FRM that is coupled to said I/O cells.

48. The integrated circuit of claim 47 where, during normal operation, said FRMs of said modules are not involved, other than configuring state of said I/O cells of said modules.

49. The integrated circuit of claim 47 where, in order to implement engineering changes in one or more of said modules, or interconnection pattern of said modules, during normal operation at least one of said FRMs of said modules adds logic functionality to said integrated circuit.

50. A device comprising:
a core having a set of input and output leads; and
an REFAB having a number of outer input leads and a corresponding number of inner output leads, and a number of inner input leads, and a corresponding number of outer output leads;
where said output leads of said core are connected to said inner input leads of said REFAB, and said input leads of said core are coupled to said inner output leads of said REFAB.

* * * * *